United States Patent
Takeda

(10) Patent No.: US 6,717,800 B2
(45) Date of Patent: Apr. 6, 2004

(54) SHIELD PLATE MOUNTING APPARATUS

(75) Inventor: Kenichi Takeda, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 147 days.

(21) Appl. No.: 10/115,851

(22) Filed: Apr. 3, 2002

(65) Prior Publication Data

US 2002/0149922 A1 Oct. 17, 2002

(30) Foreign Application Priority Data

Apr. 6, 2001 (JP) ............................... U.M. 2001-001957

(51) Int. Cl.[7] .................................................. G06F 1/16
(52) U.S. Cl. ...................... 361/682; 348/787; 348/789; 348/844; 312/7.2; 386/46
(58) Field of Search ........................ 361/682; 348/787, 348/789, 836, 805, 818, 820, 844; 312/7.2; 386/46

(56) References Cited

U.S. PATENT DOCUMENTS

| | | | |
|---|---|---|---|
| 4,658,298 A | * 4/1987 | Takeda et al. | ............... 348/838 |
| 5,094,513 A | * 3/1992 | Fukuda | ....................... 312/7.2 |
| 5,583,582 A | * 12/1996 | Higuchi et al. | ............. 348/836 |

FOREIGN PATENT DOCUMENTS

| | | | |
|---|---|---|---|
| JP | 62-94697 | 6/1987 | |
| JP | 64-6406 | 1/1989 | |
| JP | 3013868 | 5/1995 | |
| JP | 407288755 A | * 10/1995 | ............ H04N/5/64 |
| JP | 3075808 | 12/2000 | |

* cited by examiner

Primary Examiner—Darren Schuberg
Assistant Examiner—Yean-Hsi Chang
(74) Attorney, Agent, or Firm—Rosenthal & Osha L.L.P.

(57) ABSTRACT

A shield plate mounting apparatus is disclosed which mounts a shield plate 4 on a casing 3 of a recording/reproducing apparatus 2 formed to be integral with a television receiver. In this shield plate mounting apparatus, a plurality of projection portions 7a to 7c are provided on the casing 3 at predetermined angular intervals to project therefrom. A slip-off preventing piece 8 is formed to be integral with each of the projection portions 7a and 7b and as to bend from the top end of each of the portions 7a and 7b in a direction nearly perpendicular thereto. A plurality of kinds of mounting angles α of the shield plate 4 are set, and a plurality of through holes 9a to 9c respectively facing the projection portions 7a to 7c are pierced through the shield plate 4 correspondingly to each of the kinds of the mounting angles α.

3 Claims, 7 Drawing Sheets

SHIELD PLATE MOUNTING APPARATUS

BACKGROUND OF THE INVENTION

The present invention relates to a shield plate mounting apparatus for mounting a shield plate onto a casing of equipment, such as a recording/reproducing apparatus integrated with, for example, a television receiver, at a predetermined mounting angle.

FIG. 6 shows what is called a televideo, in which a television receiver 1 and a recording/reproducing apparatus 2, such as a magnetic tape unit and a DVD, are integrated with each other. To solve the problems that the recording/reproducing apparatus 2 is adversely affected by a magnetic field, which is generated by a magnetic source, such as a focusing coil 1a and a flyback transformer 1b of the television receiver 1, and that noises are caused on, for instance, a reproducing screen, a shield plate 4 is mounted on a casing 3 of the recording/reproducing apparatus 2.

Although screwing is an ordinarily conceivable means for mounting the shield plate 4, the number of components increases by that of necessary screws. Moreover, a screwing operation is time-consuming and troublesome. Furthermore, the manufacturing cost of the apparatus is high.

Thus, it is considered according to techniques described in, for instance, the Unexamined Japanese Utility Model No. Sho64-6406 that as illustrated in FIGS. 7A, 7B and 8, a steel top board portion 3a of the casing 3 is partly cut and raised so as to provide a plurality of (in this case, three) nearly-L-shaped projection portions 5 there in at predetermined angular intervals in such a manner as to protrude therefrom, and that as indicated by phantom lines in FIG. 7B, the shield plate 4 is elastically deformed and the circumferential portions thereof are engaged with the projection portions 5, respectively. Consequently, the shield plate 4 is fixed in such a way as to be unable to move in frontward, rearward, leftward, and rightward directions a to d and in an upward direction e and in a downward direction f.

Incidentally, in the case of an example illustrated in FIG. 7A, an opposite angle which a longitudinal axis A passing through the center O of the casing 3 forms with a longitudinal axis B passing through the center O of the shield plate 4, that is, a mounting angle α of the shield plate 4 is set at 30° to thereby prevent the recording/reproducing apparatus from being adversely affected by a magnetic field that is generated by a magnetic source, such as the focusing coil 1a and the flyback transformer 1b. However, when the screen size of the television receiver 1 is changed to, for example, 14 inches or 25 inches measured diagonally, the positional relation between the magnetic source and the recording/reproducing apparatus 2 also changes. Thus, it is necessary to change the mounting angle α of the shield plate 4.

To meet the aforementioned requirement, a plurality of kinds of top board portions 3a, which differ in positions of the projection portion 5 from one another, are preliminarily prepared. Thus, the mounting angle α of the shield plate 4 is changed to 0 (see FIG. 9A) or 90° (see FIG. 9B).

However, in the case of the television receiver of the aforementioned configuration, it is necessary to engage the circumferential portion of the shield plate 4 with each of the projection portions 5 of the top board portion 3a by elastically deforming and downwardly bending the shield plate 4 by a relatively large force. Such engagement is time-consuming and troublesome.

Further, it is necessary for changing the mounting angle α of the shield plate 4 to prepare a plurality of kinds of top board portions 3a, which are adapted to differ from one another in positions of the projection portions so that the top board portion 3a is changed to respond to the change in the mounting angle. Thus, the manufacturing cost of the apparatus is increased by the preparation of a plurality of kinds of top board portions 3a.

In view of the drawbacks of the conventional apparatus, an object of the present invention is to provide a shield plate mounting apparatus enabled to reduce the manufacturing cost of a recording/reproducing apparatus by easily mounting a shield plate thereon at a desired mounting angle.

SUMMARY OF THE INVENTION

To achieve the fore going object, according to a first aspect of the invention, there is provided a shield plate mounting apparatus for mounting a shield plate on a casing of a recording/reproducing apparatus formed in such a way as to be integral with a television receiver, which comprises a plurality of projection portions provided on the casing at predetermined angular intervals in such a manner as to project therefrom, and a slip-off preventing piece formed in such a way as to be integral with a corresponding one of the projection portions and as to extend from the top end of each of the projection portions by being bent in a direction nearly perpendicular thereto. In this shield plate mounting apparatus, a plurality of mounting angles of the shield plate are set, and a plurality of through holes respectively facing the projection portions are pierced through the shield plate correspondingly to each of the mounting angles.

With such a configuration, predetermined through holes pierced through the shield plate are fitted onto the projection holes of the casing only by pushing the shield plate against the casing and causing the shield plate to slide during a state in which the shield plate is elastically deformed in a slightly upward direction.

Moreover, even in the case that change in the positional relation between the recording/reproducing apparatus and each of the magnetic sources, such as a focusing coil and a flyback transformer, is caused owing to change in the size of the television receiver, the mounting angle of the shield plate can suitably be changed in response to the change in the positional relation therebetween. This can reliably solve the drawback that the recording/reproducing apparatus is adversely affected, and that noises occur in a reproduced image.

Furthermore, there is no necessity for preparing a plurality of casings that differ from one another in positions of the projection portions, which are changed according to the change in the mounting angle of the shield plate, and that are prepared in the conventional apparatus. Thus, the cost of the apparatus can be reduced for that.

According to a second aspect of the invention, there is provided a shield plate mounting apparatus for mounting a shield plate on a casing of equipment, which comprises a plurality of projection portions provided on the casing at predetermined angular intervals in such a manner as to project therefrom and a slip-off preventing piece formed in such a way as to be integral with a corresponding one of the projection portions and as to extend from the top end of each of the projection portions by being bent in a direction nearly perpendicular thereto. In this shield, a plurality of through holes are pierced through the shield plate in such a fashion as to face the projection portions.

With this configuration, the through holes pierced through the shield plate are fitted onto the projection portions only by pushing the shield plate against the casing and causing the shield plate to slide during a state in which the shield plate is elastically deformed in a slightly upward direction. Thus, the shield plate can easily be mounted on the shield plate at a predetermined mounting angle.

According to a third aspect of the invention, in the second aspect of the invention, a plurality of mounting angles of the shield plate are set. Moreover, a plurality of through holes respectively facing the projection portions are pierced through the shield plate correspondingly to each of the mounting angles.

With this configuration, the shield plate can easily be mounted on the casing at a predetermined mounting angle only by fitting predetermined ones of the plurality of through holes, which are pierced through the shield plate, onto the projection portions. Moreover, there are no needs for preparing a plurality of casings that differ from one another in positions of the projection portions, which are changed according to the change in the mounting angle of the shield plate, and that are prepared in the conventional apparatus. Thus, the cost of the apparatus can be reduced for that.

BRIEF DESCRIPTION OF THE DRAWINGS

[FIG. 1]
FIG. 2 is an enlarged longitudinally sectional view of a primary portion of the shield plate mounting apparatus.
FIG. 3 is an exploded perspective view of the shield plate mounting apparatus.
[FIG. 4]
[FIG. 5]
FIG. 6 is a side view illustrating what is called a televideo.
[FIG. 7]
FIG. 8 is an enlarged longitudinally sectional view of a primary portion of the conventional shield plate mounting apparatus.
[FIG. 9]

DETAILED DESCRIPTION OF THE PREFERRED EMBODIMENTS

Figure 1A:
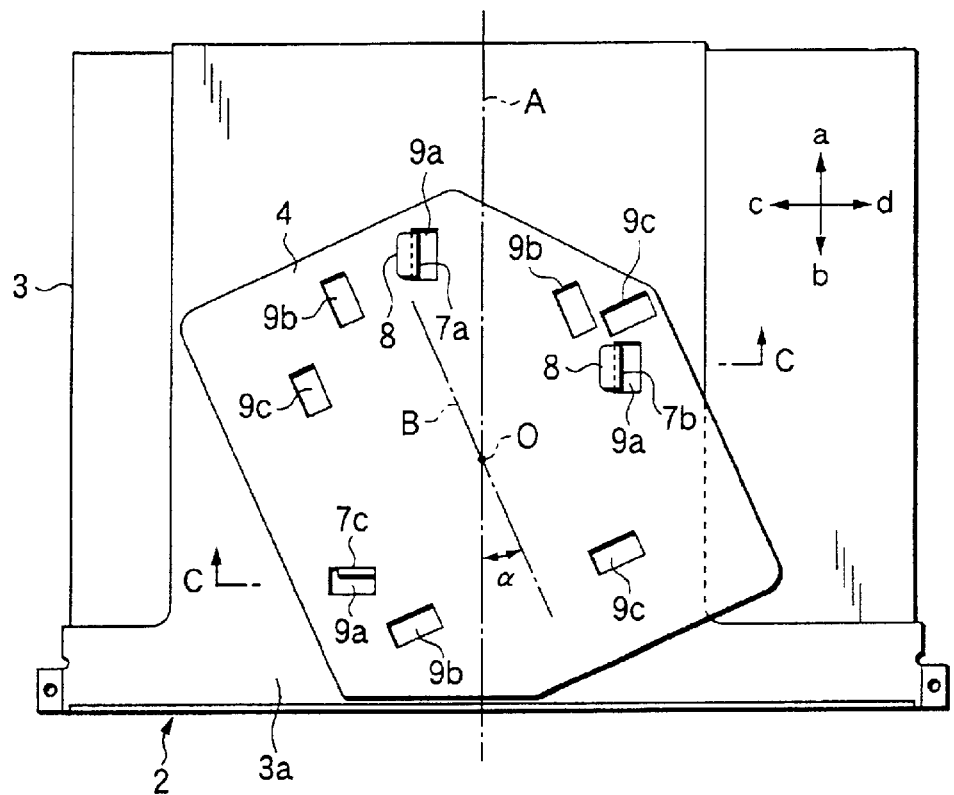
FIG. 1A is a plan view illustrating a shield plate mounting apparatus that is an embodiment of the invention.
Figure 1B:
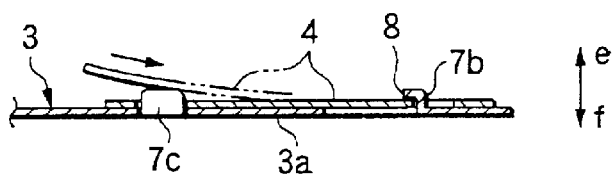
FIG. 1B is a view taken in the direction of arrows C, C of FIG. 1A.
Figure 2:
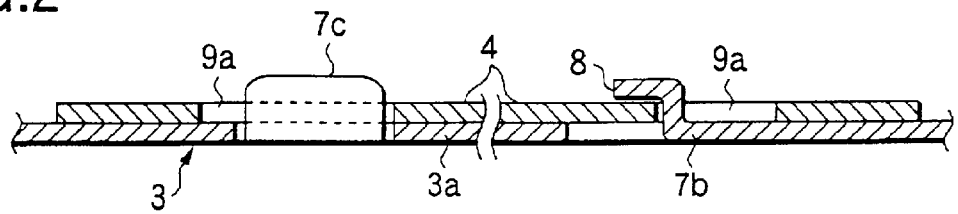
[FIG. 2]
Figure 3:
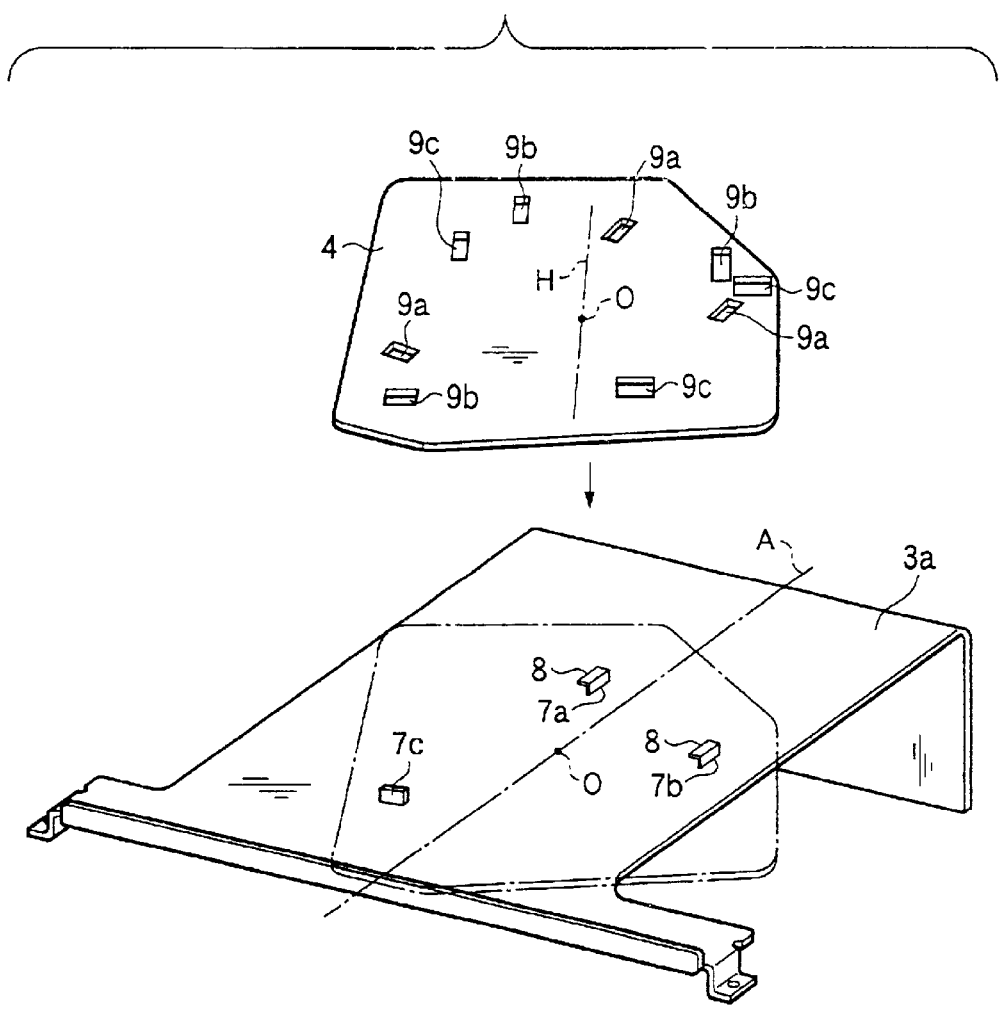
[FIG. 3]

FIGS. 1 to 3 illustrate a shield plate mounting apparatus that is an embodiment of the invention. A steel top board portion 3a of a casing 3 of a recording/reproducing apparatus (or equipment) of what is called a televideo is partly cut and raised to thereby provide a plurality of (in this embodiment, three) projection portions 7a to 7c. Among the projection portions 7a to 7c, the two rear-side projection portions 7a and 7b are provided parallel to the longitudinal axis A of the casing 3 in such a way as to protrude therefrom. Moreover, a slip-off preventing piece 8 bending from the top end of each of the projection portions 7a and 7b is formed in such a manner as to be integral therewith. The front-side projection portion 7c is provided in such a way as to project along a direction nearly perpendicular to the longitudinal axis A. Further, a plurality of kinds of mounting angles α (in this embodiment, three kinds of angles=30°, 0, and 90°) are set, and a plurality of through holes 9a to 9c respectively facing the projection portions 7a to 7c are pierced through the shield plate 4 correspondingly to each of the kinds of the mounting angles α. The other constituent elements are nearly the same as those illustrated in FIGS. 6 to 9B. Thus, in the figures, like reference characters are adapted to designate like portions. Further, the description of such portions is omitted herein.

Figure 4A:
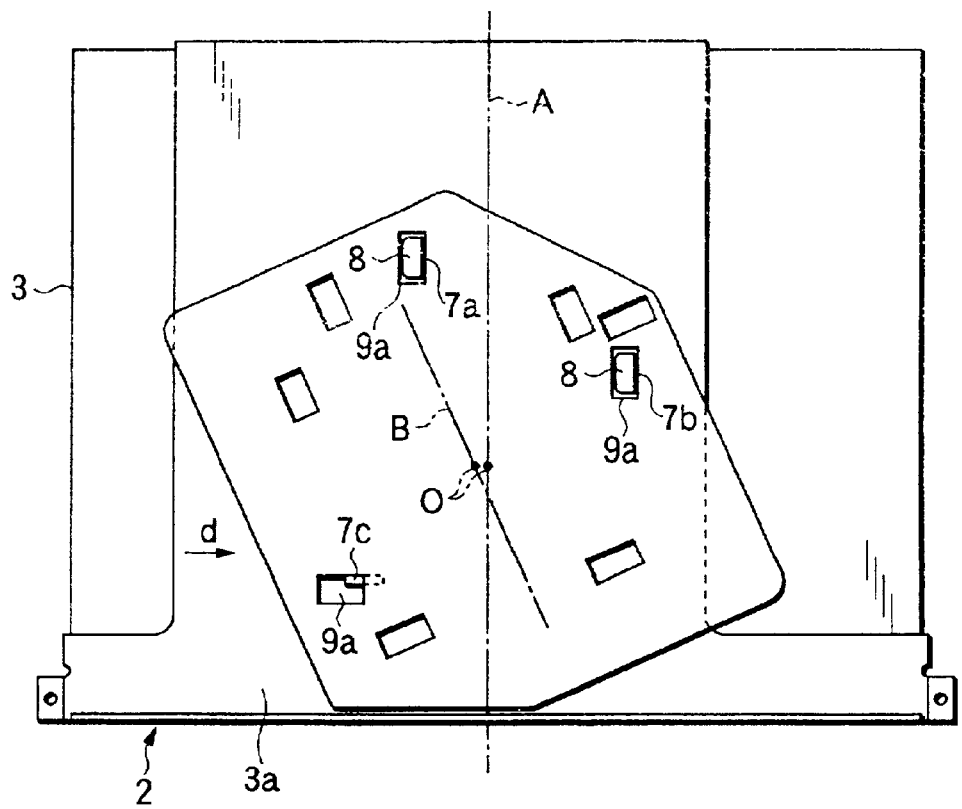
FIG. 4A is a plan view illustrating a procedure for mounting the shield plate.
Figure 4B:
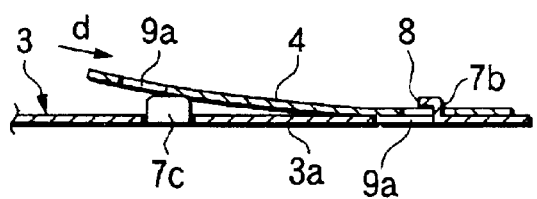
FIG. 4B is a longitudinally sectional view illustrating the procedure.

In the case that the shield plate 4 is mounted on the casing 3 at a mounting angle of, for example, 30° in the apparatus of the aforementioned configuration, it is sufficient that the through holes 9a corresponding to the mounting angle of 30° are fitted onto the two rear-side projection portions 7a and 7b, as illustrated in FIGS. 4A and 4B, and that the shield plate 4 is pushed against the top plate portion 3a and then caused to slide to the right d, as viewed in this figure, during a state in which the shield plate 4 is elastically deformed in a slightly upward direction. Thus, the through hole 9a corresponding to the mounting angle α of 30° is fitted onto the front-side single projection portion 7c. Moreover, the top surface of the shield plate 4 is engaged with the slip-off preventing piece 8 formed in such a way as to be integral with each of the two rear-side projection portions 7a and 7b. Thus, the shield plate 4 can be fixed onto the casing 3 at the mounting angle of 30° in such a way as to be unable to move in the frontward, rearward, leftward and rightward directions a to d, and the upward and rearward directions e and f (see FIGS. 1A and 1B).

Figure 5A:
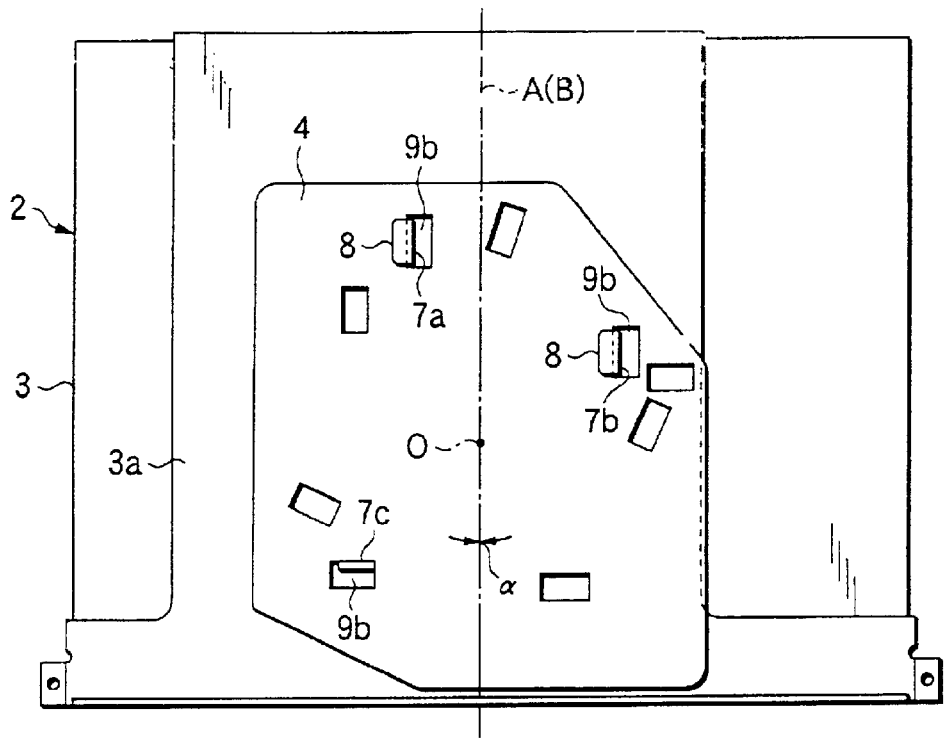
FIGS. 5A and 5B are plan views each illustrating a state in which the mounting angle of the shield plate is changed in the embodiment.
Figure 5B:
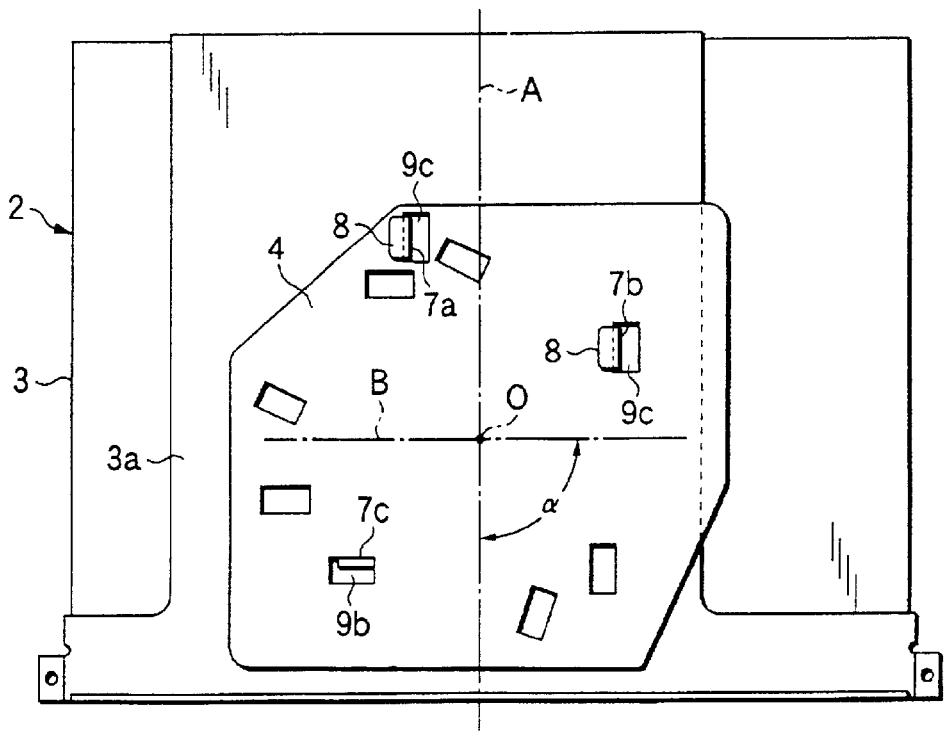
Figure 6:
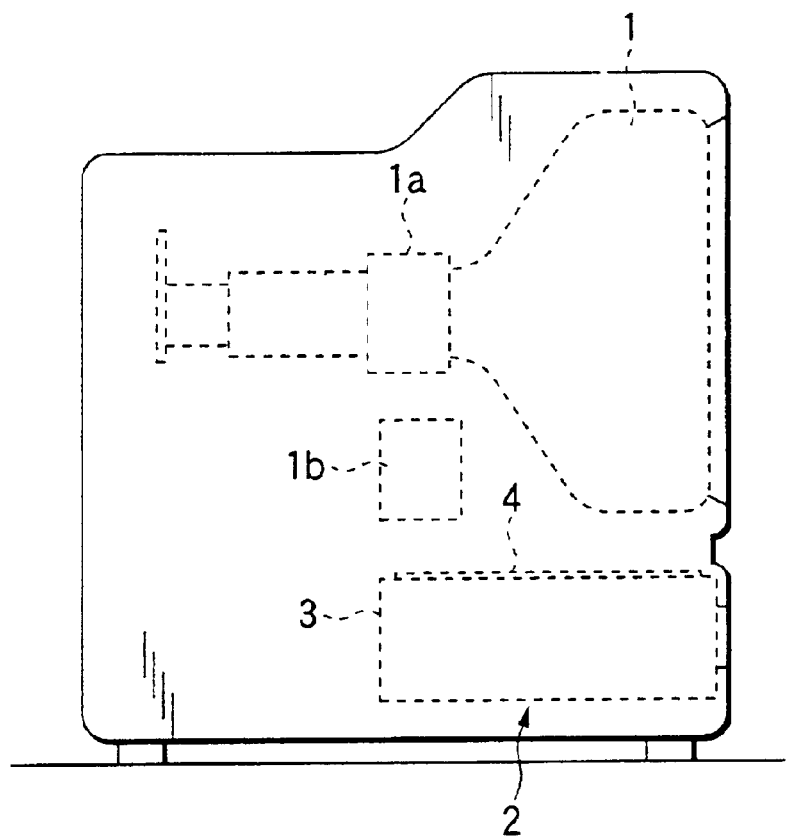
[FIG. 6]
Figure 7A:
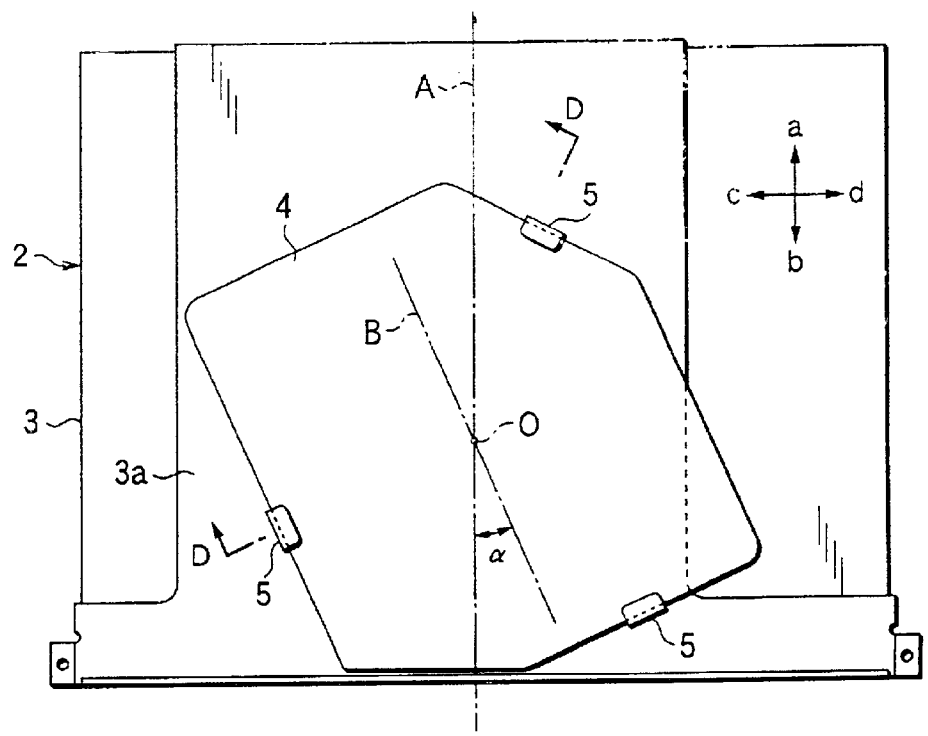
FIG. 7A is a plan view illustrating a conventional shield plate mounting apparatus.
Figure 7B:
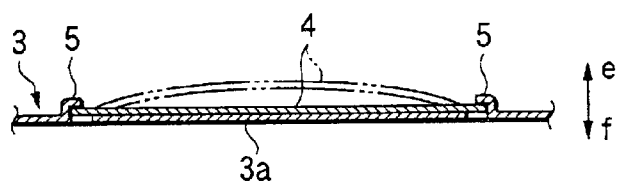
FIG. 7B is a view taken in the direction of arrows D, D of FIG. 7A.
Figure 8:
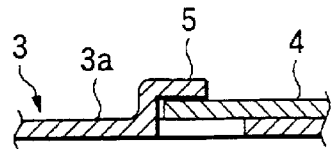
[FIG. 8]
Figure 9A:
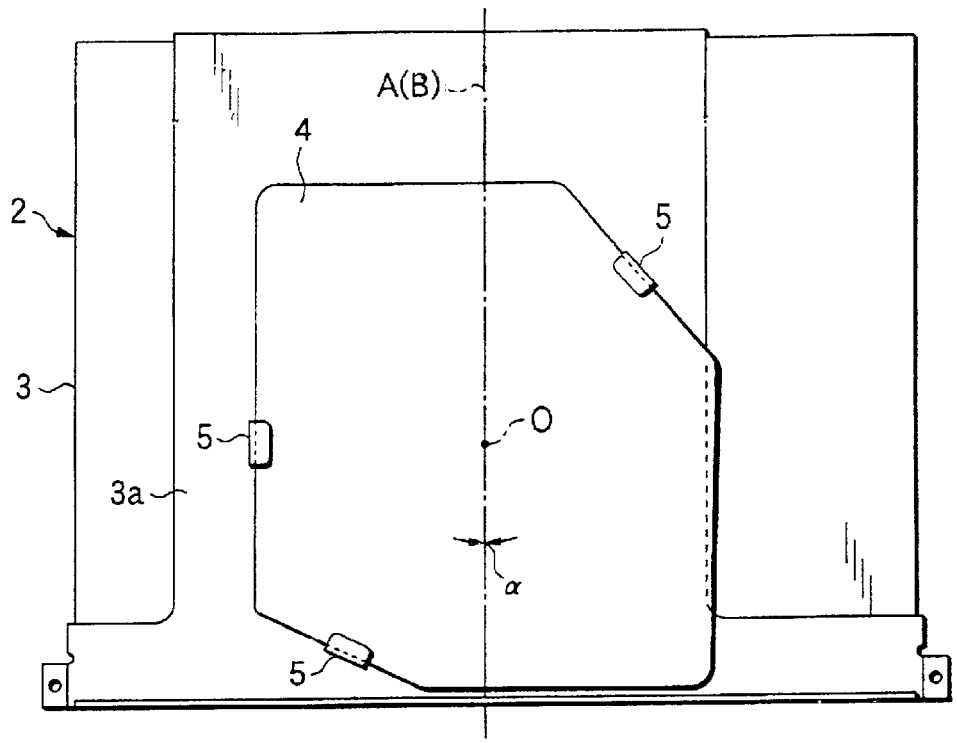
FIGS. 9A and 9B are plan views each illustrating a state in which a mounting angle of the shield plate is changed in the conventional shield plate mounting apparatus.
Figure 9B:
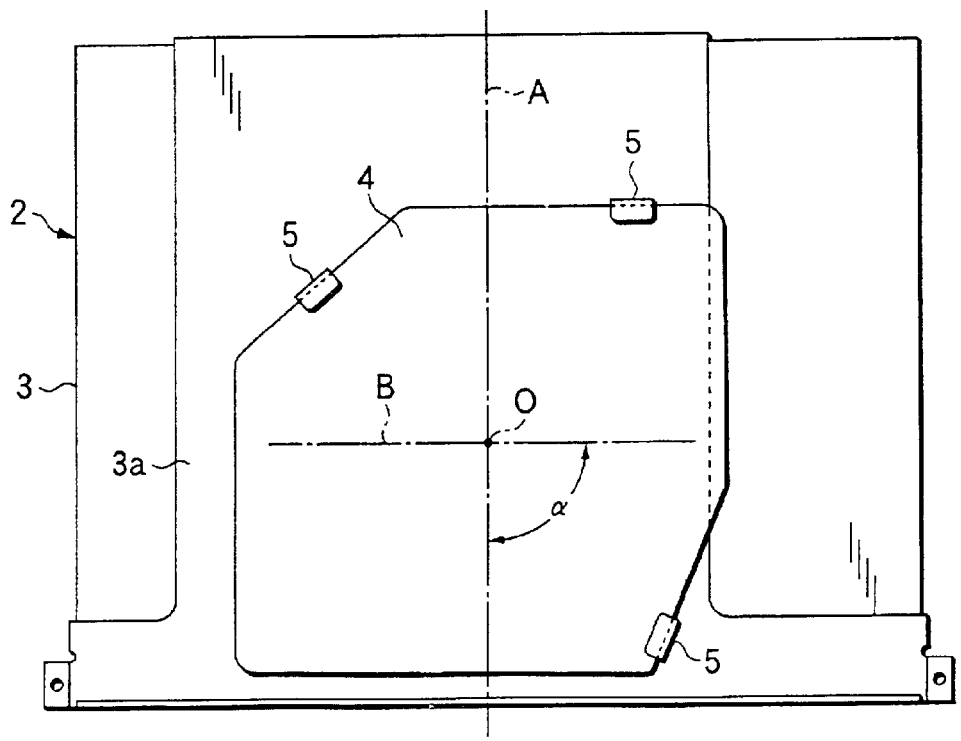

Next, in the case that the shield plate 4 is mounted on the casing 3 at a mounting angle α of, for example, 0 therein, it is sufficient that the through holes 9b corresponding to the mounting angle of 0 are fitted onto the projection portions 7a to 7c, as illustrated in FIG. 5A. Further, in the case that the shield plate 4 is mounted on the casing 3 at a mounting angle α of, for example, 90° therein, it is sufficient that the through holes 9c corresponding to the mounting angle α of 90° are fitted onto the projection portions 7a to 7c, as illustrated in FIG. 5B.

With the aforementioned configuration, predetermined through holes 9a to 9c pierced through the shield plate 4 are fitted onto the projection portions 7a to 7c of the casing 3 only by pushing the shield plate 4 against the top board portion 3a and causing the shield plate 4 to slide in a state in which the shield plate is elastically deformed in a slightly upward direction. Thus, the shield plate 4 can easily be mounted on the casing 3.

Further, even in the case that change in the positional relation between the recording/reproducing apparatus 2 and each of the magnetic sources, such as the focusing coil 1a and the flyback transformer 1b, is caused owing to change in the size of the television receiver 1, the mounting angle α of the shield plate 4 can be suitably changed in response to the change in the positional relation therebetween. This can reliably solve the drawbacks that the recording/reproducing apparatus 2 is adversely affected, and that noises occur in a reproduced image.

Furthermore, there is no necessity for preparing a plurality of top board portions 3a (see FIGS. 7A to 9B) that differ from one another in positions of the projection portions 7a to 7c, which are changed according to the change in the mounting angle α of the shield plate 4, and that are prepared in the conventional apparatus. Thus, the cost of the apparatus can be reduced for that.

Although the slip-off preventing piece 8 is formed on the rear-side projection portions 7a and 7b in such a way as to be integral therewith in the aforementioned embodiment, the slip-off preventing piece of the invention is not limited thereto. It is sufficient that the slip-off preventing piece is formed on at least one of the projection portions 7a to 7c.

Additionally, although what is called a televideo has been described in the foregoing description by way of example, an object, to which the invention is applied, is not limited thereto. The invention can be applied to various kinds of equipment that needs to prevent adverse effects due to the magnetic source by using the shield plate.

According to the first aspect of the invention, the predetermined through holes pierced through the shield plate are fitted onto the projection holes of the casing only by pushing the shield plate against the casing and causing the shield plate to slide in a state in which the shield plate is elastically deformed in a slightly upward direction.

Moreover, even in the case that change in the positional relation between the recording/reproducing apparatus and each of the magnetic sources, such as the focusing coil and the flyback transformer, is caused owing to change in the size of the television receiver, the mounting angle of the shield plate can suitably be changed in response to the change in the positional relation therebetween. This can reliably solve the drawbacks that the recording/reproducing apparatus is adversely affected, and that noises occur in a reproduced image.

Furthermore, there is no necessity for preparing a plurality of casings that differ from one another in positions of the projection portions, which are changed according to the change in the mounting angle of the shield plate, and that are prepared in the conventional apparatus. Thus, the cost of the apparatus can be reduced for that.

According to the second aspect of the invention, the through holes pierced through the shield plate are fitted onto the projection portions only by pushing the shield plate against the casing and causing the shield plate to slide in a state in which the shield plate is elastically deformed in a slightly upward direction. Thus, the shield plate can easily be mounted on the casing at a predetermined mounting angle.

According to the third aspect of the invention, the shield plate can easily be mounted on the casing at a predetermined mounting angle only by fitting predetermined ones of the plurality of through holes, which are pierced through the shield plate, onto the projection portions. Moreover, there are no needs for preparing a plurality of casings that differ from one another in positions of the projection portions, which are changed according to the change in the mounting angle of the shield plate, and that are prepared in the conventional apparatus. Thus, the cost of the apparatus can be reduced for that.

What is claimed is:

1. A shield plate mounting apparatus for mounting a shield plate on a casing of a recording/reproducing apparatus formed to be integral with a television receiver, said shield plate mounting apparatus comprising:

a plurality of projection portions provided on said casing at predetermined angular intervals to project therefrom; and a slip-off preventing piece formed to be integral with a corresponding one of said projection portions and to extend from a top end of each of said projection portions by being bent in a direction nearly perpendicular thereto, wherein a plurality of mounting angles of said shield plate are set, and a plurality of through holes respectively facing said projection portions are pierced through said shield plate correspondingly to each of said mounting angles.

2. A shield plate mounting apparatus for mounting a shield plate on a casing of equipment, said shield plate mounting apparatus comprising:

a plurality of projection portions provided on said casing at predetermined angular intervals to project therefrom; and a slip-off preventing piece formed to be integral with a corresponding one of said projection portions and to extend from a top end of each of said projection portions by being bent in a direction nearly perpendicular thereto, wherein a plurality of through holes are pierced through said shield plate to face said projection portions, respectively.

3. The shield plate mounting apparatus according to claim 2, wherein a plurality of mounting angles of said shield plate are set, and a plurality of through holes respectively facing said projection portions are pierced through said shield plate correspondingly to each of said mounting angles.

* * * * *